United States Patent
Chen et al.

(10) Patent No.: US 8,643,078 B2
(45) Date of Patent: Feb. 4, 2014

(54) SEMICONDUCTOR STRUCTURE AND MANUFACTURING METHOD OF THE SAME

(75) Inventors: Shih-Hung Chen, Jhudong Township, HsinChu County (TW); Hang-Ting Lue, Hsinchu (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/443,417

(22) Filed: Apr. 10, 2012

(65) Prior Publication Data
US 2013/0264683 A1  Oct. 10, 2013

(51) Int. Cl.
*H01L 29/788*  (2006.01)
(52) U.S. Cl.
USPC ........ 257/315; 257/532; 257/607; 257/E29.3; 257/E29.002
(58) Field of Classification Search
USPC ............... 257/315, 532, 307, E29.3, E29.002
See application file for complete search history.

(56) References Cited

FOREIGN PATENT DOCUMENTS

TW  100116749  5/2011
TW  100119885  6/2011

OTHER PUBLICATIONS

English language translation of abstract of TW 100116749 (published May 12, 2011).
English language translation of abstract of TW 100119885 (published Jun. 7, 2011).

*Primary Examiner* — Long Pham
(74) *Attorney, Agent, or Firm* — McClure, Qualey & Rodack, LLP

(57) ABSTRACT

A semiconductor structure and a manufacturing method of the same are provided. The semiconductor structure includes a base, a stacked structure and a doped layer. The stacked structure is formed on the base, wherein the stacked structure comprises a plurality of conductive strips and a plurality of insulating strips, one of the conductive strips is located between adjacent two insulating strips, the stacked structure has a first side wall, and a long edge of the first side wall is extended along a channel direction. The doped layer is formed in the first side wall, wherein the doped layer is formed by an ion implantation applied to the first side wall, and an acute angle is contained between an implantation direction of the ion implantation and the first side wall.

8 Claims, 10 Drawing Sheets

US 8,643,078 B2

SEMICONDUCTOR STRUCTURE AND MANUFACTURING METHOD OF THE SAME

BACKGROUND

1. Technical Field

The disclosure relates in general to a semiconductor structure and a manufacturing method of the same and more particularly to a memory device and a manufacturing method of the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

In general, a dosed layer is formed on a semiconductor layer by way of ion implantation to change the doping concentration.

However, the ion implantation is perpendicularly applied to a top portion of the semiconductor layer. The deeper the implantation is, and the larger the required energy is, such that the damage to the semiconductor layer becomes more serious.

SUMMARY

The disclosure is directed to a semiconductor structure and a manufacturing method of the same.

One aspect of the disclosure relates to a semiconductor structure. In one embodiment, the semiconductor structure includes a base, a stacked structure and a doped layer. The stacked structure is formed on the base, wherein the stacked structure comprises a plurality of conductive strips and a plurality of insulating strips, one of the conductive strips is located between adjacent two insulating strips, the stacked structure has a first side wall, and a long edge of the first side wall is extended along a channel direction. The doped layer is formed in the first side wall, wherein the doped layer is formed by an ion implantation applied to the first side wall, and an acute angle is contained between an implantation direction of the ion implantation and the first side wall.

Another aspect of the disclosure relates to a method for manufacturing a semiconductor structure. In one embodiment, the method comprises following steps. A stacked structure is formed on a base, wherein the stacked structure comprises a plurality of conductive strips and a plurality of insulating strips, one of the conductive strips is located between adjacent two insulating strips, the stacked structure has a first side wall, and a long edge of the first side wall is extended along a channel direction. An ion implantation is applied to the first side wall to form a doped layer on the first side wall, wherein an acute angle is contained between an implantation direction of the ion implantation and the first side wall The following description is made with reference to the accompanying drawings.

DETAILED DESCRIPTION

Figure 1A:
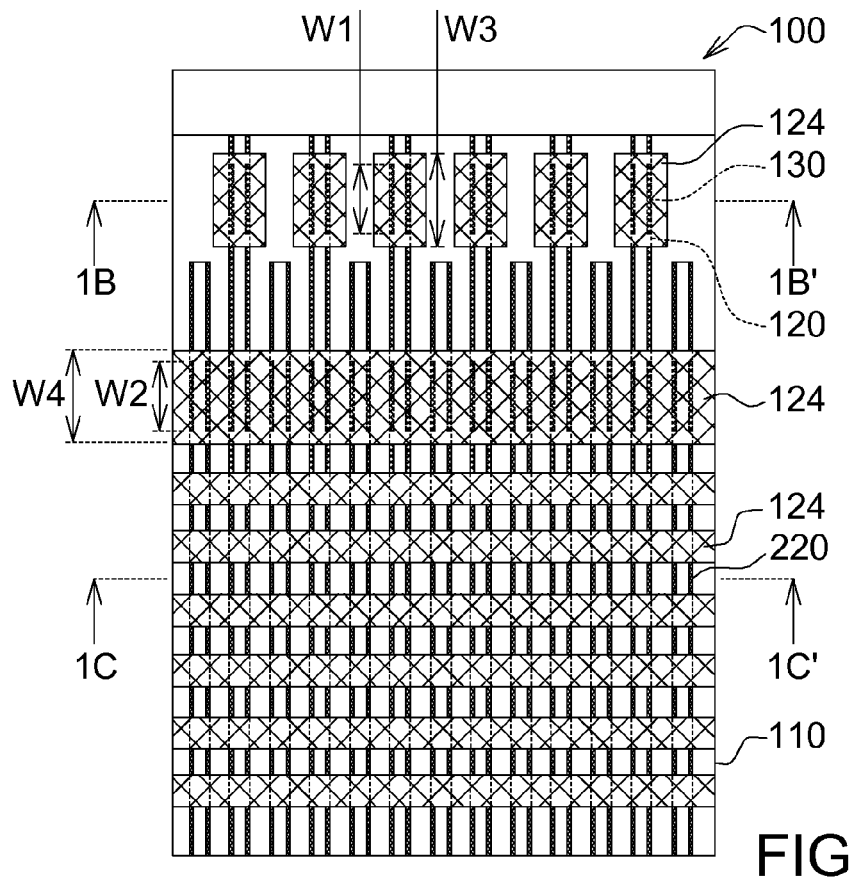
Referring to FIG. 1A illustrating a top view of a semiconductor structure according to an embodiment of the invention.

Referring to FIG. 1A, a top view of a semiconductor structure according to an embodiment of the invention is illustrated. The semiconductor structure 100 is a 3D vertical gate memory device, for example, comprising a NAND flash memory and an anti-fuse memory, etc. The semiconductor structure 100 comprises a base 110, at least one stacked structure 120 and a doped layer 130.

Figure 1B:
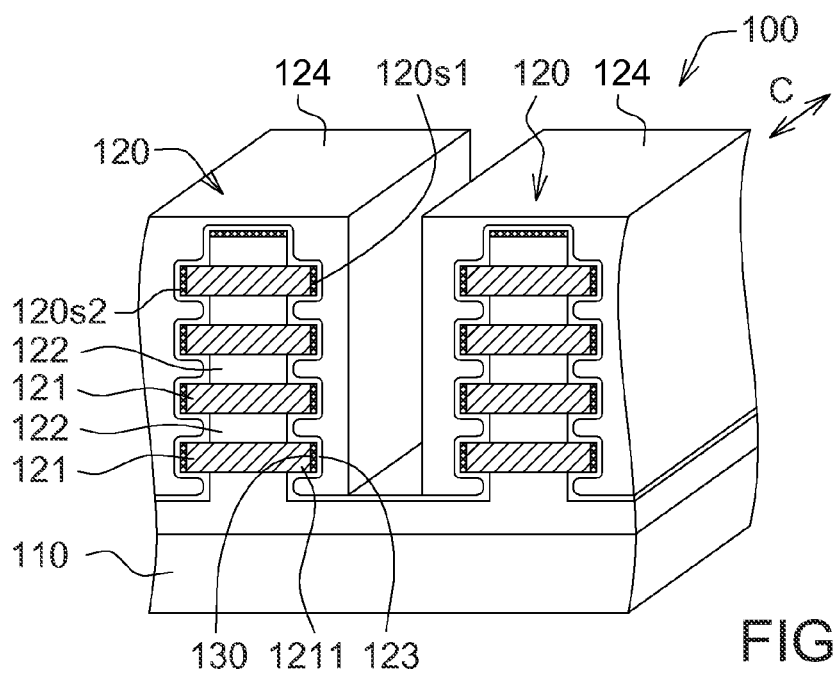
Referring to FIG. 1B illustrating a cross-sectional view along a direction 1B-1B' of FIG. 1A.

Referring to FIG. 1B, a cross-sectional view along a direction 1B-1B' of FIG. 1A is illustrated. The stacked structure 120 are formed on the base 10, wherein each the stacked structure 120 comprises a plurality of conductive strips 121, a plurality of insulating strips 122, a memory layer 123 and a conductive layer 124$m$, and has a first side wall 120$s$1 and a second side wall 120$s$2 opposite to the first side wall 120$s$1.

One of the conductive strips 121 is located between the adjacent two insulating strips 122, and the conductive strips 121 in different layers act as bit lines (BL) of memory cells of different planes. The conductive strip 121 is made from a material including a polysilicon or a metal. In addition, the conductive strip 121 has a first type conductivity. For example, the first type conductivity is N-type conductivity. The doping concentration of the conductive strip 121 ranges between $5\times10^{17}/cm^3$ and $5\times10^{19}/cm^3$.

In present embodiment, the conductive strip 121 is outward protruded relative to the insulating strip 122 to form a protrusion 1211. In addition, the insulating strip 122 is made from a material including an oxide.

The memory layer 123 encapsulates the first side wall 120$s$1. Since the protrusion 1211 of the conductive strip 121, the memory layer 123 can encapsulate more portion of the conductive strip 121. In addition, since the protrusion 1211 of the conductive strip 121, the exposed surface is increased to promote the coverage of the memory layer 123 and the conductive layer 124.

The memory layer 123, for example, is a multi-layer structure such as an ONO composite layers, an ONONO (BE-SONOS) composite layers. In present embodiment, the memory layer 123 comprises a first dielectric layer (not illustrated), a second dielectric layer (not illustrated) and a third dielectric layer (not illustrated), wherein the first dielectric layer is silicon oxide layer, the second dielectric layer is a silicon nitride layer and sandwiched in between the first dielectric layer, and the third dielectric layer is a silicon oxide layer. In another embodiment, the memory layer 123 is a single material layer (not illustrated), comprising silicon nitride, or silicon oxide such as silicon dioxide, silicon oxynitride.

The conductive layer 124 encapsulates the memory layer 123. In present embodiment, the conductive layer 124 can act as a ground selection line (GSL) and/or a source selection line (SSL).

The conductive layer 124 encapsulates the protrusion 1211 of the conductive strip 121, such that the conductive layer 124 encapsulates more portion of the conductive strip 121. Thus, an electrical current leakage is reduced and a control to gate can be promoted. In present embodiment, the conductive layer 124 is made from a material including tungsten or a polysilicon.

A long edge of the first side wall 120$s$1 of the stacked structure 120 and a long edge of the second side wall 120$s$2 of the stacked structure 120 are extended along a channel direction C, wherein the channel direction C refers to an electrical current direction, such as an extension direction of the conductive strip 121.

The doped layer 130 is formed in the first side wall 120s1 and the second side wall 120s2. The doped layer 130 is formed by an ion implantation applied to the first side wall 120s1 and the second side wall 120s2. The doped layer 130 has a second type conductivity which is different from the first type conductivity of the conductive strip 121. For example, the second type conductivity of the doped layer 130 is P-type conductivity. In addition, the doped depth of the doped layer 130 is not limited by illustration of FIG. 1B. In another embodiment, the doped depth of the doped layer 130 is substantially equal to the protruding length of the protrusion 1211.

Figure 1C:
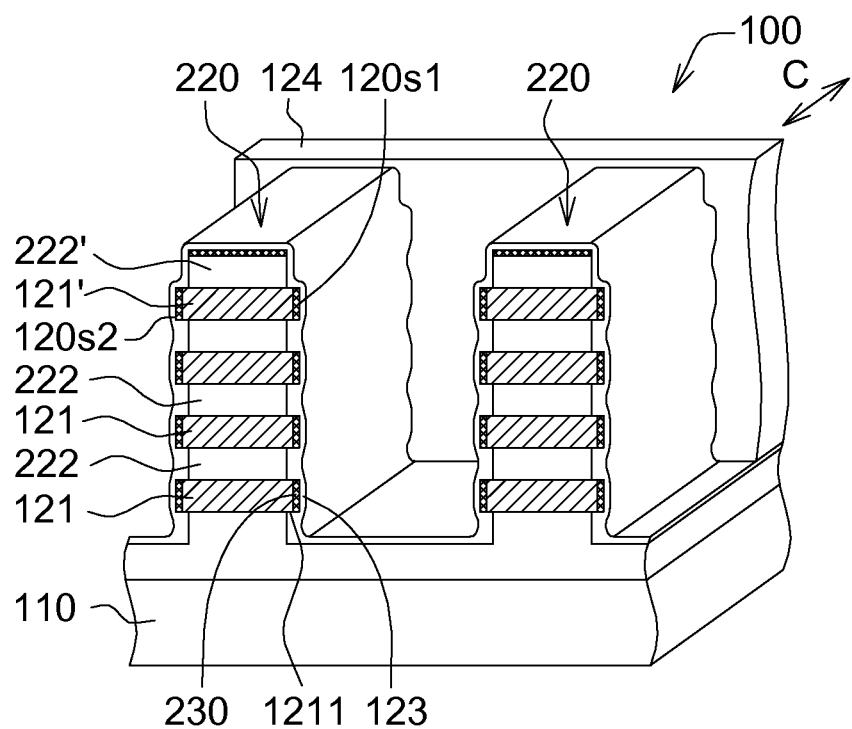
Referring to FIG. 1C illustrating a cross-sectional view along a direction 1C-1C' of FIG. 1A.

Referring to FIG. 1C, a cross-sectional view along a direction 1C-1C' of FIG. 1A is illustrated. The stacked structure 220 is formed on the base 110. The stacked structure 220 is formed in a region within which a memory cell is formed. In another embodiment, only one of the stacked structure 220 and 120 is formed in the semiconductor structure 100.

The stacked structure 220 comprises a plurality of conductive strips 121, a plurality of insulating strips 222, a memory layer 123 and a conductive layer 124.

Each conductive strip 121 is outward protruded relative to the insulating strip 222 to form a protrusion 1211. Compared with the protrusion 1211 illustrated in FIG. 1B, the protrudent length of the protrusion 1211 of FIG. 1C is shorter.

The topmost insulating strip 222' of the stacked structure 220 is a blocking layer, which can block the ion implantation to be applied to a top portion of the conductive strip 121' connected adjacent to the topmost insulating strip 222'. Under the circumstances that a material and/or thickness of the insulating strip 222' is appropriately designed, the insulating strip 222' can block the ion implantation to be applied to a top portion of the conductive strip 121' connected adjacent to the topmost insulating strip 222'. For example, the insulating strip 222' can be an oxide layer, a nitrides layer or a photo-resist. In another embodiment, the thickness of the insulating strip 222' is thicker than the insulating strips 222 below the insulating strip 222'.

In present embodiment, the doped layer 230 is selectively formed in the first sidewall 120s1 and/or the second sidewall 120s2 to reduce the resistance of the conductive strip 121. The doped layer 230 has a first type conductivity, which is identical to the first type conductivity of the conductive strip 121, for example, the first type conductivity of the conductive strip 121 is N-type conductivity. In addition, the doping concentration of the doped layer 230 is larger than that of the conductive strip 121, for example, the doping concentration of the doped layer 230 ranges between $5 \times 10^{17}/cm^3$ and $2 \times 10^{20}/cm^3$.

Referring to FIGS. 2 to 11C, manufacturing processes of a semiconductor structure according to an embodiment of the invention are illustrated.

Figure 2:
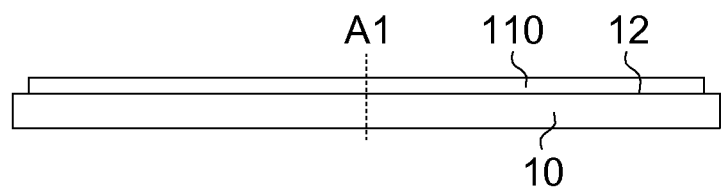
Referring to FIGS. 2 to 11C illustrating manufacturing processes of a semiconductor structure according to an embodiment of the invention.

Referring to FIG. 2, a base 10 is disposed on a carrying surface 12 of a carrier 10, wherein an axis A1 of the carrier 10 is substantially perpendicular to the carrying surface 12.

Referring to FIGS. 2 to 11C, manufacturing processes of a semiconductor structure according to an embodiment of the invention are illustrated.

Figure 3A:
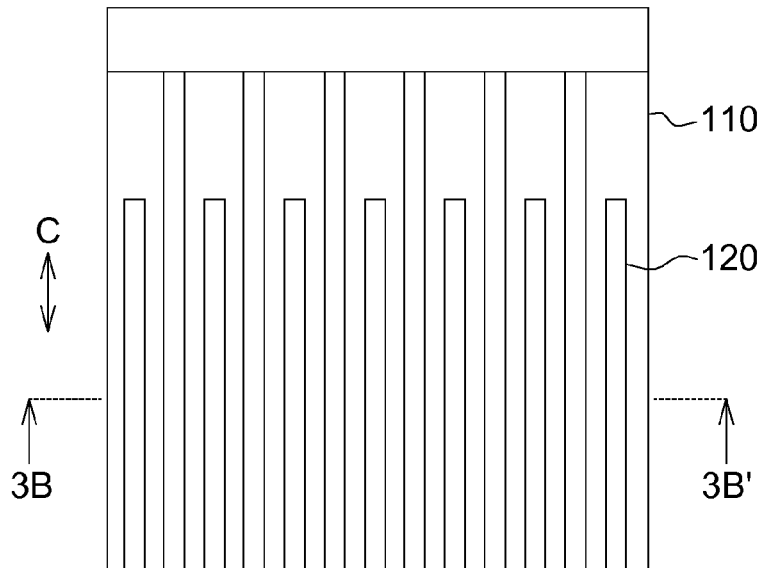
Figure 3B:
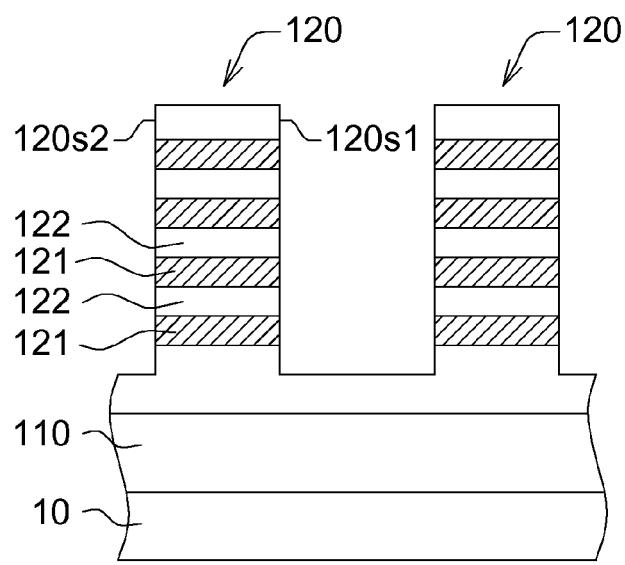

Referring to FIG. 3A, a top view of the base of FIG. 2 is illustrated, and referring to FIG. 3B (two stacked structures 120 are illustrated), a cross-sectional view along a direction 3B-3B' of FIG. 3A is illustrated.

In FIG. 3A, at least one stacked structure 120 is formed on the base 10.

In FIG. 3B, the stacked structures 120 comprise a plurality of conductive strips 121 and a plurality of insulating strips 122, wherein one of the conductive strips 121 is located between the adjacent two insulating strips 122. The stacked structure 120 has a first side wall 120s1 and a second side wall 120s2 opposite to the first side wall 120s1, wherein a long edge of the first side wall 120s1 and a long edge of the second side wall 120s2 are extended along a channel direction C (illustrated in FIG. 3A).

Figure 4:
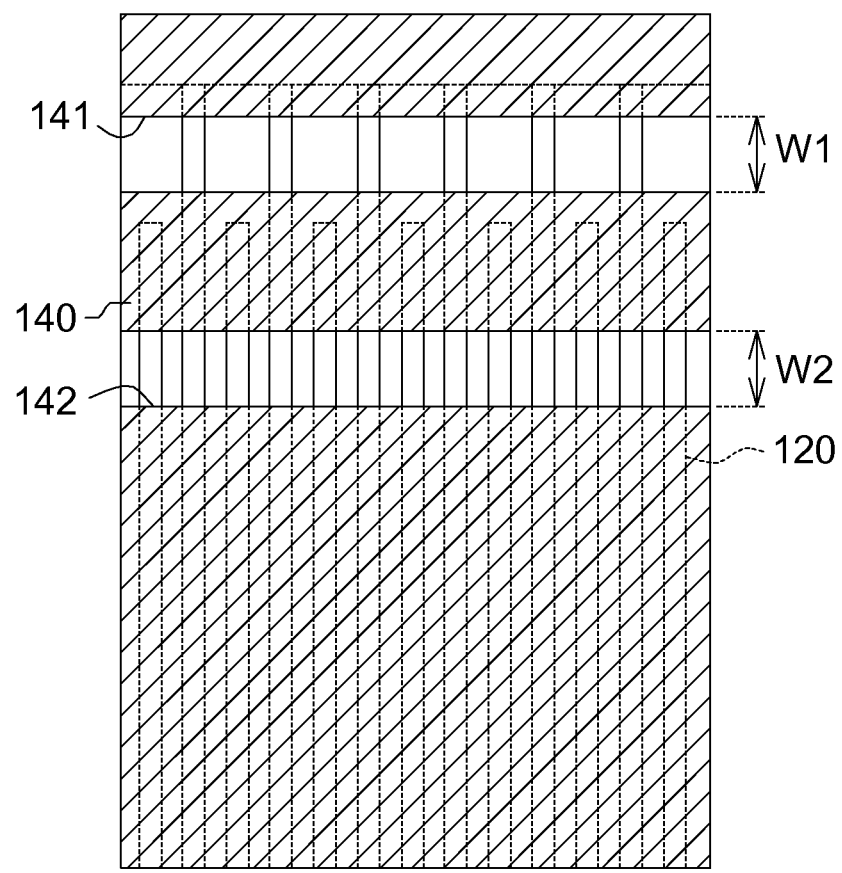

Referring to FIG. 4, a patterned photo-resist layer 140 covering the stacked structure 120 is formed, wherein the patterned photo-resist layer 140 has a first opening 141 and a second opening 142. The patterned photo-resist layer 140 has a first opening 141 and a second opening 142 define forming regions of at least one ground selection line (GSL) and at least one source selection line (SSL) respectively. In addition, the first opening 141 and the second opening 142 have a first doping width W1 and a second doping width W2 respectively, such that the doping layer 130 (which is formed in the step as illustrated in FIG. 5) formed within the first opening 141 and the second opening 142 has several corresponding widths.

Figure 5:
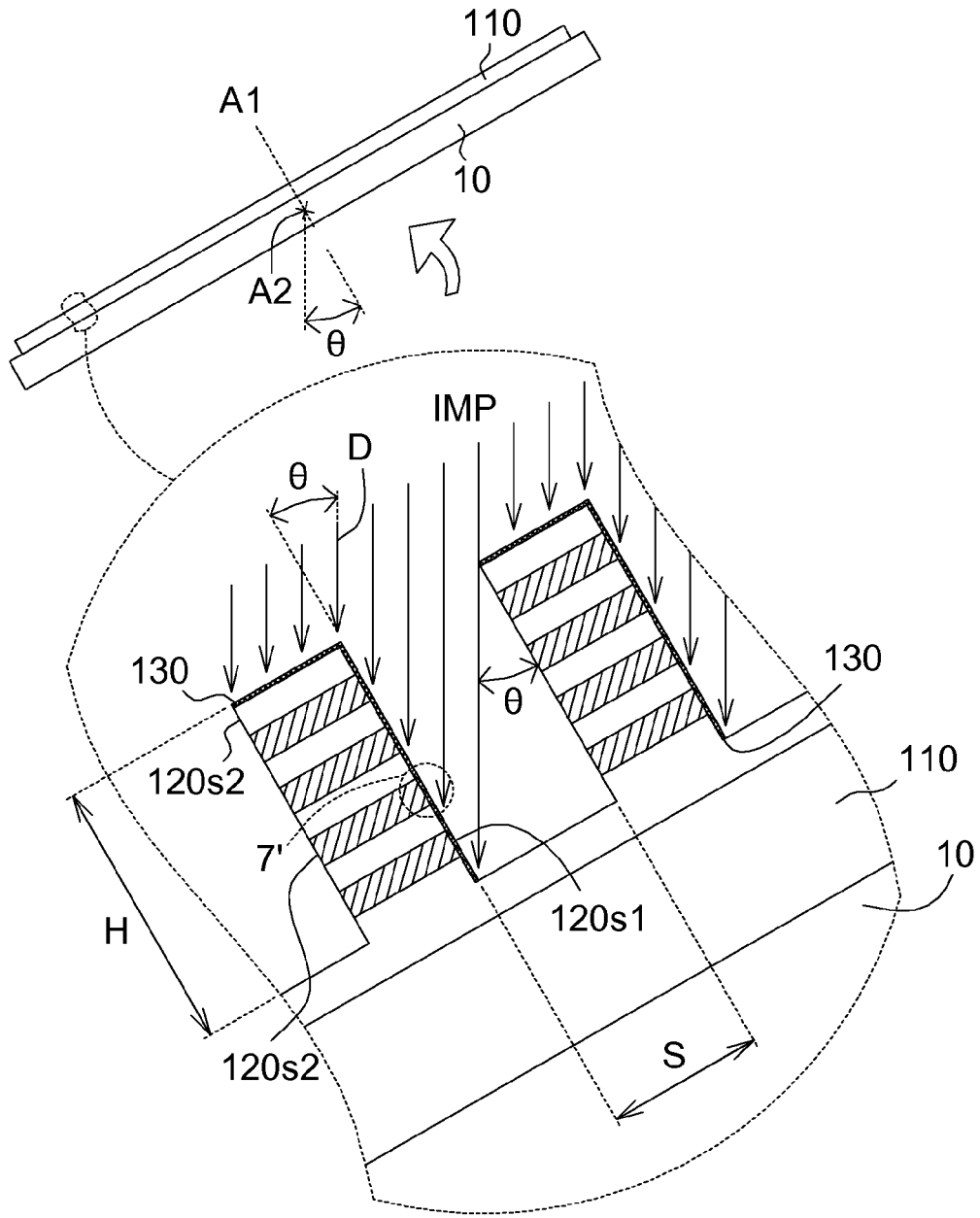

Referring to FIG. 5, the carrier 10 is tilted by a acute angle θ around an axis A2 to drive the stacked structure 120 formed on the base 110 to tilt by the acute angle θ, wherein the axis A2 is substantially perpendicular to a paper surface and the axis A1.

In FIG. 5, an ion implantation IMP is applied to the first side wall 120s1 to form a doped layer 130 in the first side wall 120s1. Since the carrier 10 is tilted by the acute angle θ, the acute angle θ is contained between an implantation direction D and the first side wall 120s1. In present embodiment, the implantation direction D is substantially perpendicular to the channel direction C (the channel direction C is perpendicular to paper surface).

In present embodiment, the stacked structure 120 has a bottom surface 120b, wherein the first side wall 120s1 is substantially perpendicular to the bottom surface 120b. Under the circumstances, the acute angle θ can be determined by formula (1). In one embodiment, the acute angle θ can be less than or equal to 30 degrees, such embodiment is not meant to be limiting.

$$\theta \leq \tan^{-1}\left(\frac{S}{H}\right) \quad (1)$$

In formula (1), S represents an interval between the adjacent two stacked structures 120, and H represents a height of each stacked structure 120. Since the acute angle θ is determined according to formula (1), the ion implantation IMP can be applied to a lower portion of the first side wall 120s1 (for example, the bottommost conductive strip 121), such that the implantation IMP can be applied to the entire or most of the first side wall 120s1.

In addition, the acute angle θ can be designed according to different geometry shape of stacked structured 120.

Figure 6:
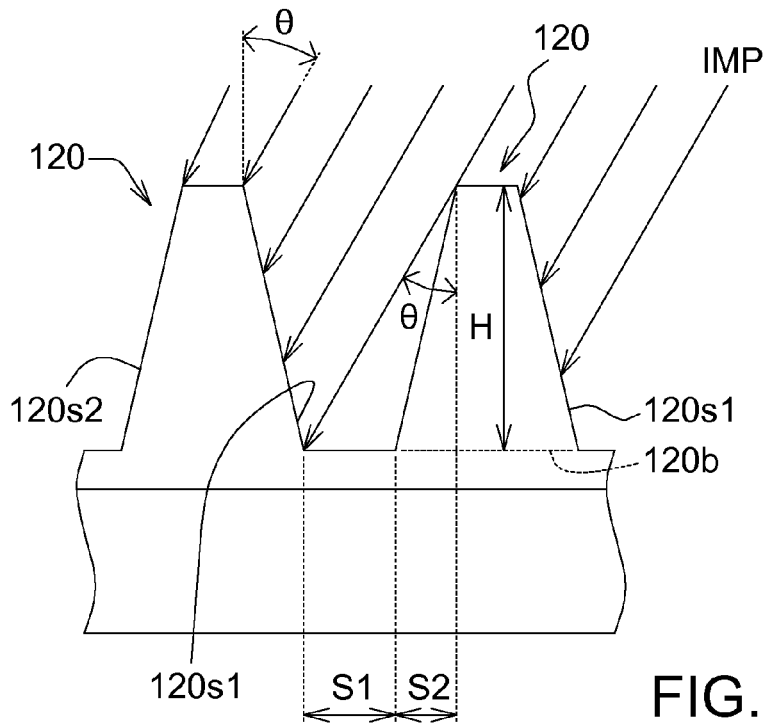

Referring to FIG. 6 (the conductive strip and the insulating layer are illustrated), a cross-sectional view of a stacked structure according to another embodiment of the invention is illustrated. A first side wall 120s1 of the stacked structure 120 is slope side wall, and the stacked structure 120 has a bottom surface 120b, wherein the first side wall 120s1 is not perpendicular first to the bottom surface 120b. The acute angle θ can be determined by formula $$\theta \leq \tan^{-1}\left(\frac{S1+S2}{H}\right) \quad (2)$$

(2).

In formula (2), S1 represents a minimum interval between the bottoms 120b of the adjacent two stacked structures 120, S2 represents a length which the first wall projects on the bottom surface, and H represents a height of each stacked structure 120.

In another embodiment, at least one of an ion emitting tube (not illustrated) and the carrier 10 can be tilted, such that the acute angle θ is contained between the implantation direction D and the first side wall 120s1.

Figure 7:
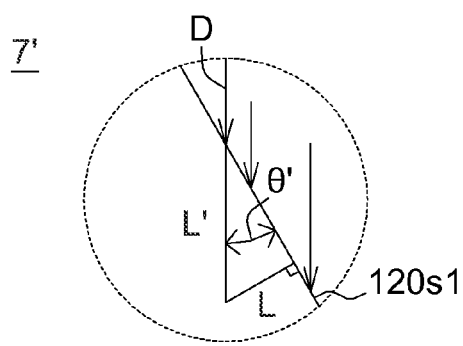

Referring to FIG. 7, an enlargement of the portion 7' of FIG. 5 is illustrated. In formula (3), as for the same design depth L, the less an angle θ' (the angle is contained between the implantation direction D and the first side wall 120s1) is, and the deeper the doping depth L' is, which represents the required energy is increased. Compared with the implantation direction D being perpendicular to a side wall (the angle θ' is very little), the required energy for tilt-type ion implantation method of present embodiment is less. In one embodiment, the angle θ' may be less than, larger than or equal to 7 degrees, such the value of angle is not meant to be limiting.

$$L = L' \times \sin(\theta') \quad (3)$$

In addition, the design depth L may be larger than a thickness of the memory layer 123 (illustrated in FIG. 1C), such that the ion implantation can be applied within the conductive strip 121.

Figure 8:
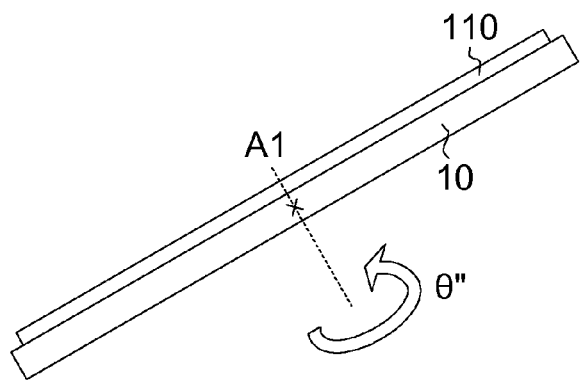

Referring to FIG. 8, the carrier 10 is rotated by an angle θ'' around the axis A1, such that the second side wall 120s2 (illustrated in FIG. 5) of the stacked structure 120 faces the implantation direction D for the doping layer 130 can be formed on the second side wall 120s2. The angle θ'' is such as 180 degrees, such embodiment is not meant to be limiting.

Then, the patterned photo-resist layer 140 illustrated in FIG. 4 is removed to expose the stacked structure 120.

Figure 9A:
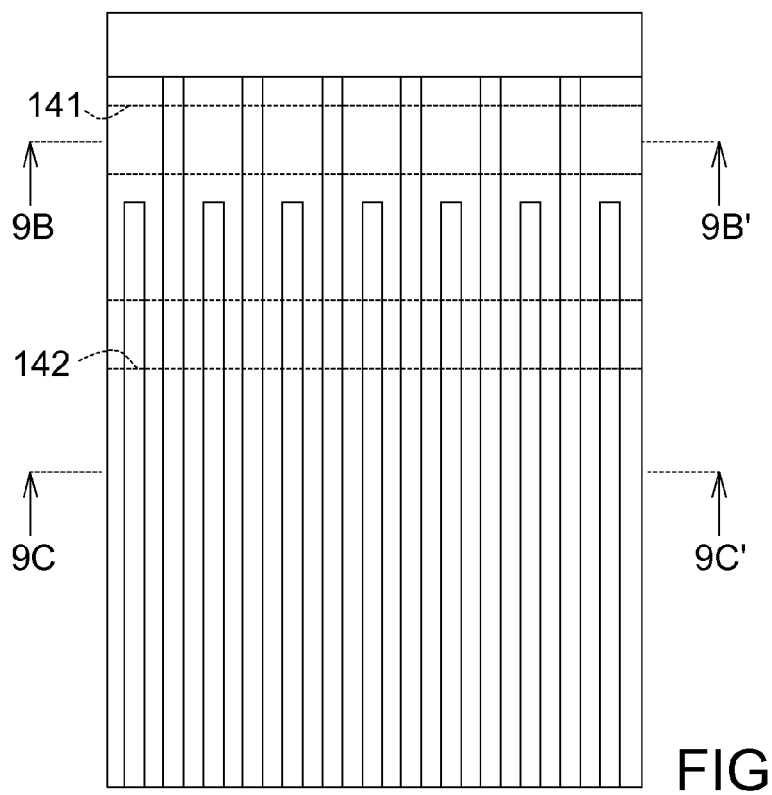

In FIG. 9A, dotted lines 141 and 142 represent the formation region of SSL and GSL respectively.

Figure 9B:
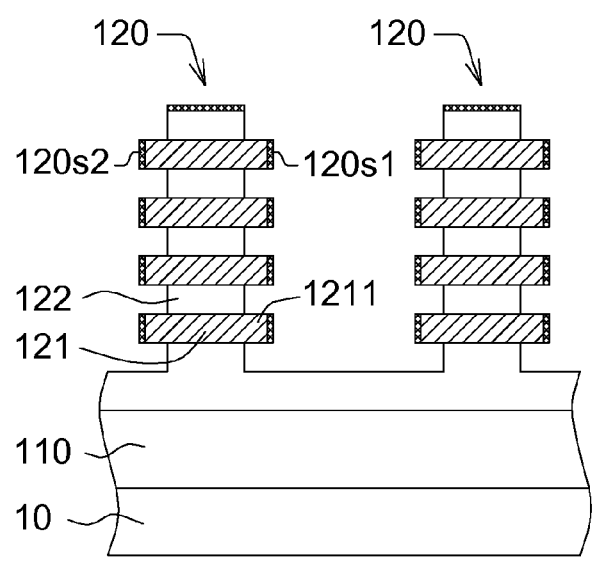

Referring to FIG. 9B, a cross-sectional view along a direction 9B-9B' of FIG. 9A is illustrated. The first side wall 120s1 and the second side wall 120s2 of the stacked structure 120 are cleaned by using a hydrofluoric acid.

Since implantation damage caused by doping layer 130, a portion of the insulating layer 122 (which corresponds to the formation region 141 of SSL) illustrated in FIG. 9B is removed, such that each conductive stripe 121 is outward protruded relative to the insulating stripe 122 to form an obvious protrusion 1211. Although not shown, the insulating stripe 122 which corresponds the formation region of GSL (the region of the dotted line 142 illustrated in FIG. 9A) can form a similar protrusion structure.

Figure 9C:
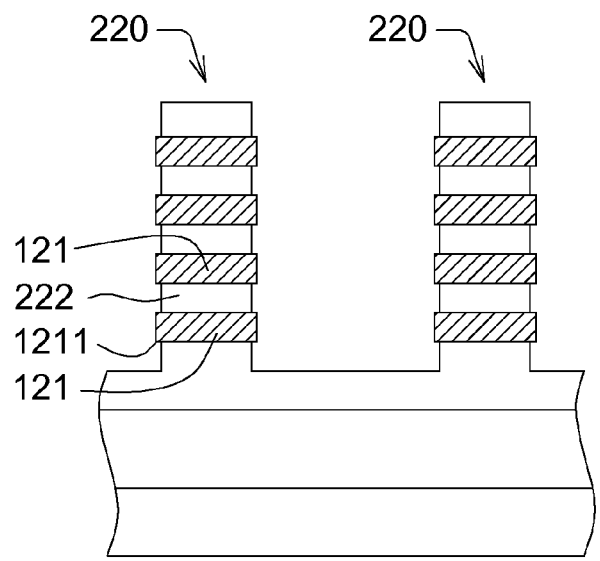

Referring to FIG. 9C, a cross-sectional view along a direction 9C-9C' of FIG. 9A is illustrated. In the step of the ion implantation (illustrated in FIG. 5), since the stacked structure 220 is covered by the patterned photo-resist layer 140 (illustrated in FIG. 4), the ion implantation is not applied to the stacked structure 220 (that is, an implantation damage is not incurred). Thus, in the step of cleaning, compared with a removing portion of the insulating strip 122 illustrated in FIG. 9B, a removing portion of the insulating strip 122 illustrated in FIG. 9C is less, such that a protrudent length of the conductive stripe 121 is shorter.

Figure 10A:
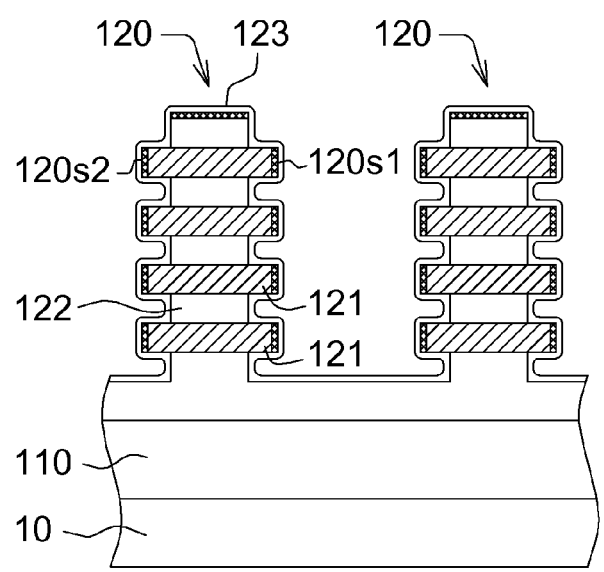
Figure 10B:
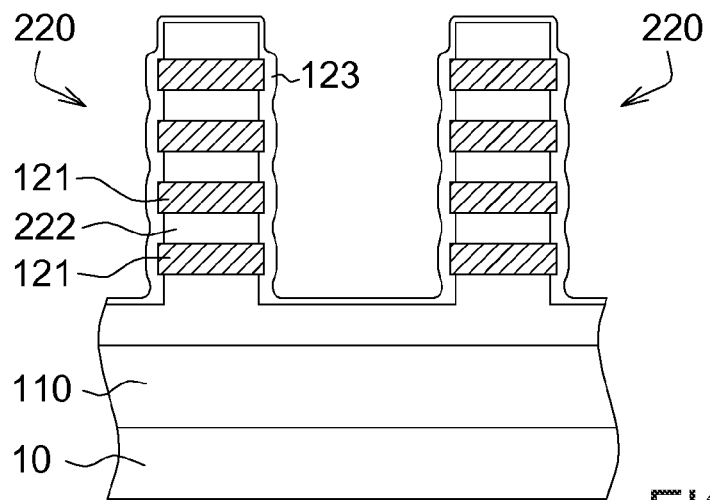

Referring to FIGS. 10A and 10B, a memory layer 123 encapsulating the stacked structure 120 illustrated in FIG. 9B and the stacked structure 220 illustrated in FIG. 9C. The memory layer 123 is such as an ONO composite layers, an ONONO (BE-SONOS) composite layers.

Figure 11A:
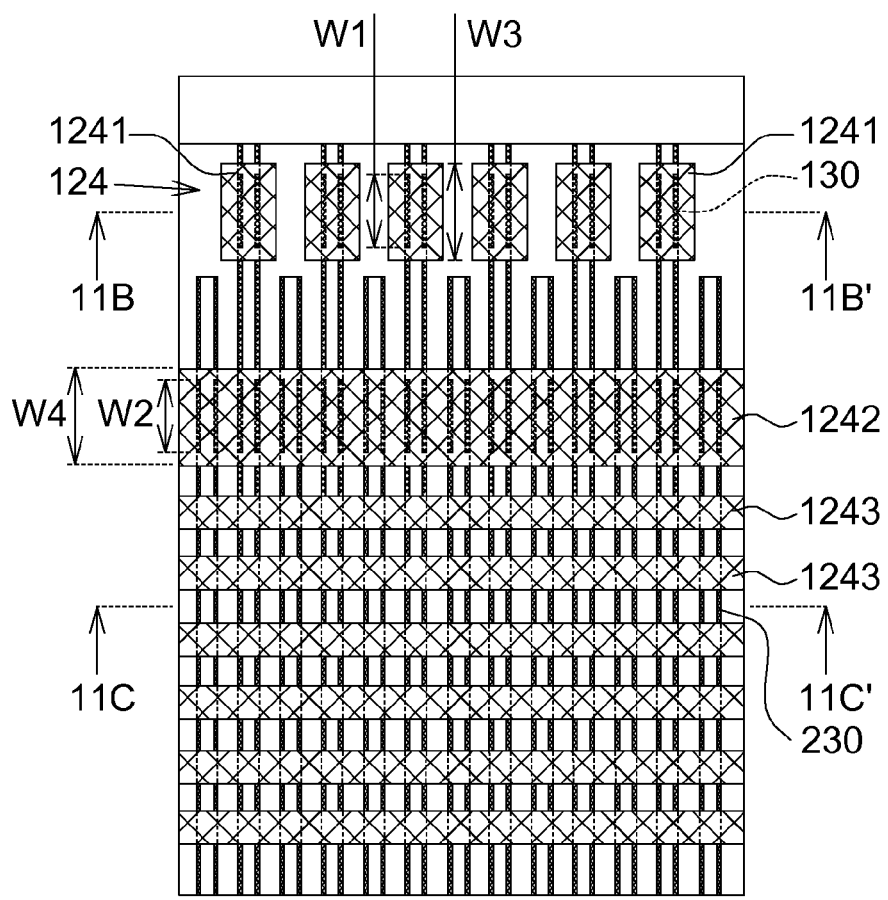

Referring to FIG. 11A, a top view of the stacked structure according to the present embodiment is illustrated. A conductive layer 124 covering the memory layer 123 (illustrated in FIG. 11B) is formed by using photolithography process, for example. In present embodiment, in an etching process, the conductive layer 124 (such as a polysilicon) is etched, and the memory layer 123 (such an ONO structure) is not etched since the process has an appropriate etching selectivity to the conductive layer 124 and the memory layer.

In FIG. 11A, the conductive layer 124 comprises a first conductive layer 1241, a second conductive layer 1242 and at least one word line 1243. The first conductive layer 1241 and the second conductive layer 1242 cover the doped layer 130 (which is formed in the step as illustrated in FIG. 5) to sever as SSL and GSL respectively. The first conductive layer 1241 and the second conductive layer 1242 have a first conductive width W3 and a second conductive width W4 respectively, wherein the first conductive width W3 and the second conductive width W4 are larger than the first doping width W1 and the second doping width W2 respectively, that is, the first conductive layer 1241 and the second conductive layer 1242 cover the entire doped layer 130 (which is formed in the step as illustrated in FIG. 5). AS a result, an effect of PN junction upon electrical current is reduced, and thus the resistance is reduced. A portion covered by the word lines 1243 forms at least one memory cell.

Figure 11B:
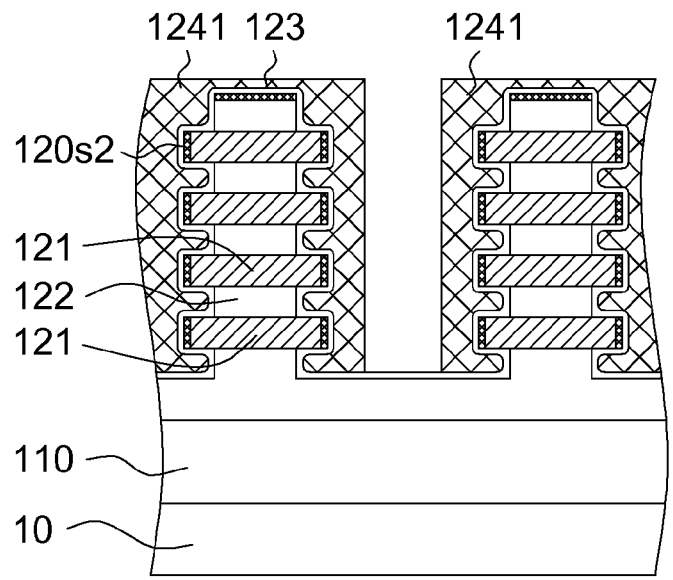

Referring to FIG. 11B, a cross-sectional view along 11B-11B' of FIG. 11A is illustrated. After the conductive layer 124 is formed, the stacked structures 120 illustrated in FIG. 1A are formed.

Figure 11C:
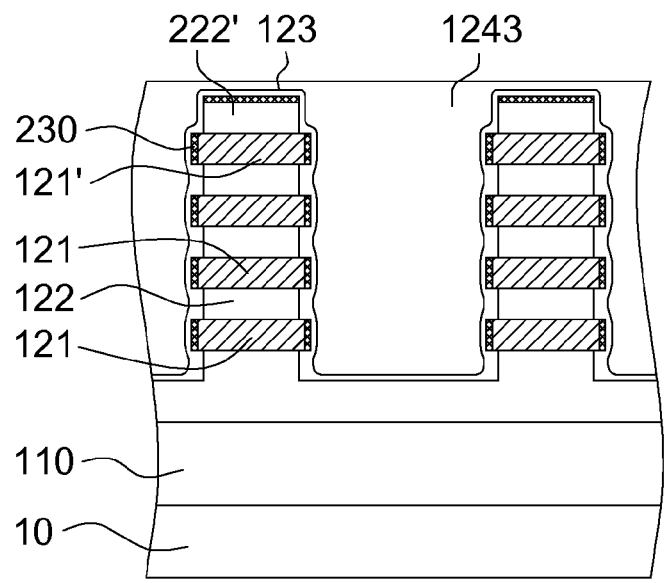

Referring to FIG. 11C, a cross-sectional view along 11C-11C' of FIG. 11A is illustrated. Selectively, the ion implantation is applied to the memory layer 123 which is not covered by the word lines 1243, by using above tilt-type ion implantation method, to reduce resistance of the conductive strip 121.

In FIG. 11C, the topmost insulating strip 222' of the stacked structure 220 is a blocking layer, which can block the ion implantation to be applied to a top portion of the conductive strip 121' connected adjacent to the topmost insulating strip 222'. Under the circumstances that a material and/or thickness of the insulating strip 222' is appropriately designed, the insulating strip 222' can block the ion implantation to be applied to a top portion of the conductive strip 121' connected adjacent to the topmost insulating strip 222'. For example, the insulating strip 222' can be an oxide layer, a nitrides layer or a photo-resist. In another embodiment, the thickness of the insulating strip 222' is thicker than the insulating strips 222 below the insulating strip 222'.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a base;
a stacked structure formed on the base, wherein the stacked structure comprises a plurality of conductive strips and a plurality of insulating strips, one of the conductive strips is located between adjacent two insulating strips, the stacked structure has a first side wall, and a long edge of the first side wall is extended along a channel direction;

a doped layer formed in the first side wall, wherein the doped layer is formed by an ion implantation applied to the first side wall, and an acute angle is contained between an implantation direction of the ion implantation and the first side wall.

2. The semiconductor structure according to claim 1, wherein the implantation direction is substantially perpendicular to the channel direction.

3. The semiconductor structure according to claim 1, wherein the topmost insulating strip is a blocking layer used for blocking the ion implantation to be applied to a top portion of the conductive strip connected adjacent to the topmost insulating strip.

4. The semiconductor structure according to claim 2, wherein the thickness of the blocking layer is thicker than the insulating strips below the blocking layer.

5. The semiconductor structure according to claim 1, wherein each conductive strip is outward protruded relative to the insulating strips to form a protrusion.

6. The semiconductor structure according to claim 5, wherein the stacked structure further comprising:
　　a memory layer encapsulating the protrusions; and
　　a conductive layer encapsulating the memory layer.

7. The semiconductor structure according to claim 6, wherein the doped layer has a doped width, and the conductive layer has a conductive width, wherein the conductive width is larger than the doped width.

8. The semiconductor structure according to claim 1, wherein the stacked structure further comprises a second side wall opposite the first side wall, and the doped layer is further formed in the second side wall.

* * * * *